US008987677B2

(12) United States Patent
Wieland et al.

(10) Patent No.: US 8,987,677 B2
(45) Date of Patent: Mar. 24, 2015

(54) CHARGED PARTICLE MULTI-BEAMLET LITHOGRAPHY SYSTEM, MODULATION DEVICE, AND METHOD OF MANUFACTURING THEREOF

(75) Inventors: Marco Jan-Jaco Wieland, Delft (NL); Ferry Michael Postma, Hoek Van Holland (NL)

(73) Assignee: Mapper Lithography IP B.V., Delft (NL)

( * ) Notice: Subject to any disclaimer, the term of this patent is extended or adjusted under 35 U.S.C. 154(b) by 439 days.

(21) Appl. No.: 12/911,861

(22) Filed: Oct. 26, 2010

(65) Prior Publication Data
US 2011/0266418 A1 Nov. 3, 2011

Related U.S. Application Data

(60) Provisional application No. 61/254,779, filed on Oct. 26, 2009.

(51) Int. Cl.
*G21K 1/08* (2006.01)
*H01J 37/317* (2006.01)
(Continued)

(52) U.S. Cl.
CPC .......... *H01J 37/3177* (2013.01); *H01J 37/07* (2013.01); *B82Y 10/00* (2013.01); *B82Y 40/00* (2013.01); *H01J 37/045* (2013.01); *H01J 37/3174* (2013.01); *H01J 2237/0262* (2013.01); *H01J 2237/0435* (2013.01); *H01J 2237/31722* (2013.01); *H01J 2237/31774* (2013.01); *H01J 2237/0437* (2013.01)
USPC .............. 250/396 R; 250/396 ML; 250/492.3

(58) Field of Classification Search
None
See application file for complete search history.

(56) References Cited

U.S. PATENT DOCUMENTS 5,719,416 A * 2/1998 Yoshimori et al. ............ 257/295
5,789,659 A * 8/1998 Williams ....................... 73/23.2
(Continued)

FOREIGN PATENT DOCUMENTS

EP 1355192 A2 * 10/2003 ............... G03F 1/16
EP 1453076 A2 * 9/2004 ............. H01J 37/04
(Continued)

OTHER PUBLICATIONS

International Search Report issued by the EPO for PCT/EP2010/066195, dated Feb. 18, 2011.
(Continued)

*Primary Examiner* — Andrew Smyth
(74) *Attorney, Agent, or Firm* — Hoyng Monegier LLP; David P. Owen; Minerva Rivero

(57) ABSTRACT

The invention relates to a modulation device for use in a charged particle multi-beamlet lithography system. The device includes a body comprising an interconnect structure provided with a plurality of modulators and interconnects at different levels within the interconnect structure for enabling connection of the modulators to one or more pattern data receiving elements. A modulator includes a first electrode, a second electrode, and an aperture extending through the body. The electrodes are located on opposing sides of the aperture for generating an electric field across the aperture. At least one of the first electrode and the second electrode includes a first conductive element formed at a first level of the interconnect structure and a second conductive element formed at a second level of the interconnect structure. The first and second conductive elements are electrically connected with each other.

29 Claims, 8 Drawing Sheets

(51) Int. Cl.
*H01J 37/07* (2006.01)
*B82Y 10/00* (2011.01)
*B82Y 40/00* (2011.01)
*H01J 37/04* (2006.01)

(56) References Cited

U.S. PATENT DOCUMENTS

| | | | |
|---|---|---|---|
| 5,822,063 A * | 10/1998 | Suzuki et al. | 356/364 |
| 6,958,804 B2 * | 10/2005 | Wieland et al. | 355/67 |
| 2002/0156539 A1 * | 10/2002 | Ahn | 700/5 |
| 2005/0211921 A1 * | 9/2005 | Wieland et al. | 250/492.2 |
| 2006/0131752 A1 * | 6/2006 | Kim et al. | 257/758 |
| 2006/0204166 A1 * | 9/2006 | Naugler et al. | 385/14 |
| 2008/0203317 A1 * | 8/2008 | Platzgummer et al. | 250/396 R |
| 2010/0127185 A1 * | 5/2010 | Fragner et al. | 250/398 |
| 2011/0079730 A1 * | 4/2011 | Wieland | 250/396 R |
| 2011/0266418 A1 * | 11/2011 | Wieland et al. | 250/208.2 |

FOREIGN PATENT DOCUMENTS

| | | | | |
|---|---|---|---|---|
| EP | 1 993 118 A2 | | 11/2008 | |
| EP | 2214194 A1 * | | 8/2010 | H01J 37/04 |
| JP | 55004011 A * | | 1/1980 | G02B 5/172 |
| JP | 2009 004366 A | | 8/2009 | |
| TW | 2004 16500 A | | 1/2004 | |
| WO | WO 2009141428 A1 * | | 11/2009 | H01J 37/317 |

OTHER PUBLICATIONS

Jpn. Appl. Phys. vol. 32 (1993), Part 1, No. 12B, pp. 6012-6017.

* cited by examiner

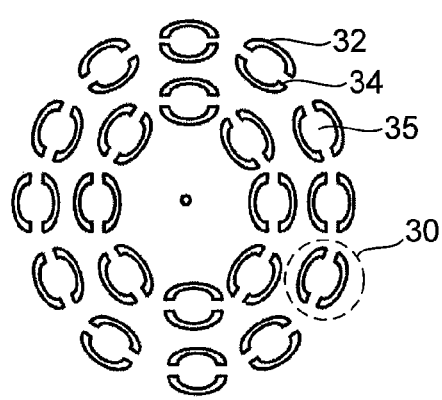
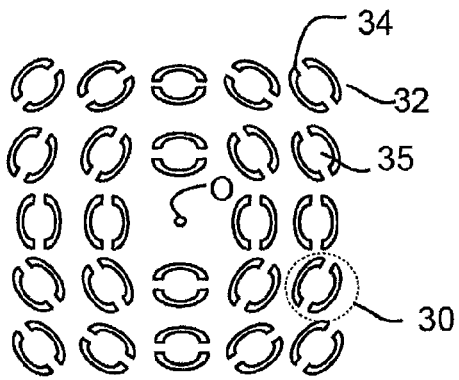
Fig. 3a                Fig. 3b
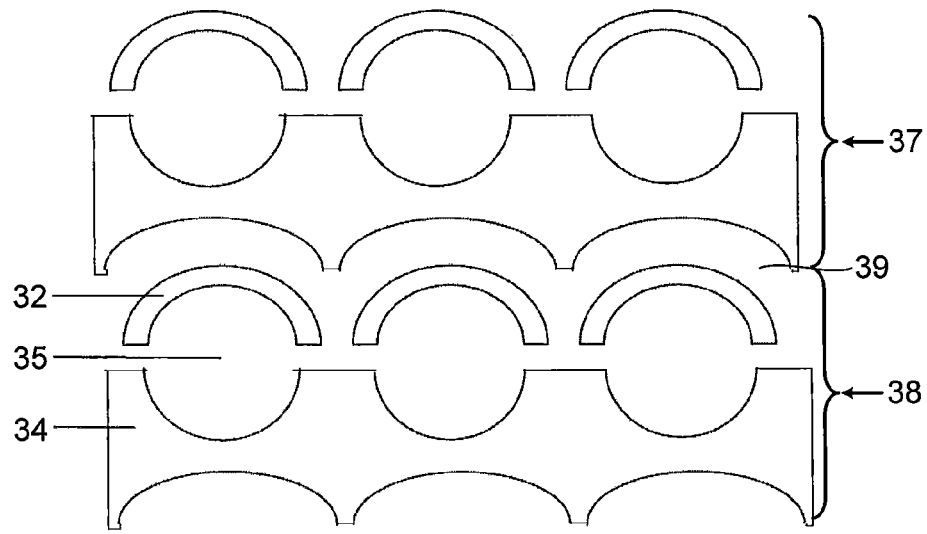
Fig. 4

CHARGED PARTICLE MULTI-BEAMLET LITHOGRAPHY SYSTEM, MODULATION DEVICE, AND METHOD OF MANUFACTURING THEREOF

BACKGROUND OF THE INVENTION

1. Field of the Invention

The invention relates to a charged particle multi-beamlet lithography system for transferring a pattern onto the surface of a target using a plurality of beamlets. The invention further relates to a modulation device for use in a charged particle multi-beamlet lithography system, and to a method of manufacturing such a modulation device.

2. Description of the Related Art

Charged particle multi-beamlet lithography systems are known, for example from U.S. Pat. No. 6,958,804. The system described in this patent preferably uses a plurality of electron beamlets to transfer a pattern to the target surface. The electron beamlets generated by a radiation source are modulated in a modulation device by electrostatic deflection in accordance with pattern data. The modulated beamlets are then transferred to the target surface. To enable high speed transfer of the pattern to the target surface, the pattern data for controlling the electrostatic deflection are transferred at least partly using optical transmission using modulated light beams.

Another charged particle multi-beamlet lithography system is known from Jpn. J. Appl. Phys. Vol. 32 (1993), Part 1, no 12B, pp. 6012-6017. The modulation device of this system comprises an array arranged for the individual deflection of 1024 beamlets. For this purpose, the modulation device comprises a substrate with 1024 apertures, each in the form of a square of 25 µm×25 µm size. The pitch of the apertures is at least 55 µm. Electrodes are provided at the edge of the apertures for generating an electric field across the apertures for deflecting a passing charged particle beamlet. Pattern data are transferred to the electrodes via wires.

In European patent application 1 453 076 it is recognized that the use of a plurality of electron beams comprising a plurality of individually controlled blanking electrodes in the form of an array as discussed in the abovementioned article creates difficulties with respect to the formation of a suitable wiring structure. To enable the use of more interconnects via wiring within a limited space European patent application 1 453 076 proposes to form a wiring substrate having a multi-layered wiring structure and an electrode substrate having a plurality of through holes and an electrode pair on opposite side walls of each through hole to control the locus of a charged particle beam passing therethrough. The wiring substrate and the electrode substrate are then bonded such that connection wiring pads of the wiring substrate are connected to the electrode pairs of the electrode substrates. Construction of separate substrates and subsequent bonding is time-consuming and costly. Furthermore, alignment of the two substrates with respect to each other is cumbersome.

BRIEF SUMMARY OF THE INVENTION

It is therefore an object of the present invention to provide a charged particle multi-beamlet lithography system which allows separate beamlets to be controlled within a pitch smaller pitch than 55 µm while achieving good reliability. For this purpose, the invention provides a charged particle multi-beamlet lithography system for transferring a pattern onto the surface of a target using a plurality of beamlets, the system comprising: a beam generator for generating a plurality of beamlets; a modulation device for patterning the plurality of beamlets in accordance with pattern data; and a projection system for projecting the patterned beamlets onto the target surface; wherein the modulation device comprises a body comprising an interconnect structure provided with a plurality of modulators and interconnects at different levels within the interconnect structure for enabling connection of the modulators to one or more pattern data receiving elements; wherein a modulator comprises a first electrode, a second electrode, and an aperture extending through the body, the electrodes being located on opposing sides of the aperture for generating an electric field across the aperture; and wherein at least one of the first electrode and the second electrode comprises a first conductive element formed at a first level of the interconnect structure and a second conductive element formed at a second level of the interconnect structure, the first and second conductive elements being electrically connected with each other.

The use of such lithography system with a plurality of modulators and interconnects at different levels within the interconnect structure enables the use of a modulator array with a reduced pitch, because individual connections can be distributed over the plurality of levels. As a result more information can be distributed within a limited space. Suitably, the pitch between modulators is less than 25 µm. Preferably, the pitch is 16 µm or less, and most preferably the pitch is 10 µm or less. Such small dimensions are compatible for features within the interconnect structure.

Additionally, sufficient deflecting strength by the modulator is achieved in that the conductive elements form an electrode that extends over more than one level of the interconnect structure. The longer deflection area in the direction of travel of the beamlets may reduce the voltage that needs to be applied over the electrodes across one aperture to obtain a certain degree of deflection. In addition, or alternatively, the longer deflection area in the direction of travel of the beamlets allows more deflection per unit voltage.

The first and second conductive elements may be connected with each other by at least one via, where the at least one via is exposed to the aperture so as to form part of the electrode. The inclusion of the at least one via further lengthens the active deflection area in the direction of travel of the beamlets. Consequently, a further reduction of deflection voltage and/or more deflection per unit voltage may be achieved.

A first modulator of the plurality of modulators may be arranged to connect to a pattern data receiving element via the first conductive element at the first level of the interconnect structure, and a second modulator of the plurality of modulators may be arranged to connect to the pattern data receiving element via the second conductive element at the second level of the interconnect structure. The use of different levels within the interconnect structure to achieve connection between modulators and light receiving elements may reduce the area of the modulation device that needs to be reserved for electric connections. The interconnects between modulators and pattern data receiving elements may be arranged in an addressable array, in which the addressable array is provided with at least one wordline and at least one bitline. Such arrangement may further limit the number of connections that is needed.

The interconnect structure may be supported by a substrate to improve the structural integrity. The substrate may be a semiconductor substrate in which a plurality of semiconductor circuitry elements is defined.

In some embodiments, the top layer of the interconnect structure is a conductive layer. The conductive top layer may define a shield that serves the purpose of preventing cross-talk between neighboring modulators. The top layer may be arranged to be at ground potential. In such case the first electrode may be arranged for connection with the pattern data receiving element, while the second electrode may be connected to the top layer.

In some embodiments, the interconnect structure is a CMOS-structure.

In some embodiments, the data receiving elements are part of the modulation device, and the data receiving elements are light sensitive elements for converting light signals into corresponding electric signals. The light sensitive elements may be Ge-diodes provided on top of the interconnect structure.

The invention further relates to a charged particle multi-beamlet lithography system for transferring a pattern onto the surface of a target using a plurality of beamlets, the system comprising: a beam generator for generating a plurality of beamlets; a modulation device according to any one of the preceding claims for deflecting the plurality of beamlets in accordance with pattern data; a beamlet stop array for selectively blocking the deflected beamlets so as to form patterned beamlets; and a projection system for projecting the patterned beamlets onto the target surface. in some embodiments, such a lithography system is arranged to allow passage of a group of beamlets through a single aperture in the beamlet stop array. In addition, corresponding deflectors in the modulation device may be arranged to deflect the beamlets towards blocking positions onto the beamlet array such that the blocking positions are substantially homogeneously spread around the single aperture in the beamlet stop array. Directing deflected beamlets towards blocking positions that are substantially homogeneously spread around the single aperture allows for a relatively even degradation of the surface of the beam stop array in areas surrounding the single aperture. As a result, the lifetime of the beamlet stop array may increase.

The invention further relates to a method of manufacturing a modulation device comprising: providing a body comprising an interconnect structure provided with a plurality of modulators and interconnects at different levels within the interconnect structure for enabling connection of the modulators to one or more pattern data receiving elements, wherein a modulator comprises a first electrode, and a second electrode, and wherein at least one of the first electrode and the second electrode comprises a first conductive element formed at a first level of the interconnect structure and a second conductive element formed at a second level of the interconnect structure, the first and second conductive elements being electrically connected with each other; and forming apertures extending through the body such that the first electrode and the second electrode of a modulator of the plurality of modulators are located on opposing sides of the aperture for generating an electric field across the aperture.

Forming of apertures may include: depositing a first resist layer; depositing an insulating layer on top of the first resist layer; depositing a second resist layer on top of the first resist layer; exposing the second resist layer in accordance with a pattern such that the second resist layer can be removed on top of locations where apertures are to be formed, and selectively removing the second resist layer in accordance with the pattern; etching the insulating layer using the second resist layer as first etch mask; etching the first resist layer using the etched insulating layer as a second etch mask; and etching the body using the etched first resist layer as a third etch mask so as to form the apertures.

In some embodiments, the forming of apertures includes chemically selective etching of insulating material so as to expose at least one of a surface of the first electrode, a surface of the second electrode and a via used for connecting conductive elements within one of the electrodes. By exposing an electrode surface within the aperture, the influence of the respective electrode on a passing charged particle beamlet improves. The chemically selective etching may include wet etching.

In some embodiments, the provided body further comprises a substrate for supporting the interconnect structure. In such cases, embodiments of the forming of apertures may comprise a step of etching holes in the substrate. A process flow suitable to etch holes in the substrate may include anisotropic etching using a Bosch process.

In some embodiments, the pattern data receiving elements are diodes for converting light signals into electric signals, and the method further comprises: bonding a plate of diode material onto the interconnect structure; and patterning the plate to obtain diodes at predetermined locations. The plate may comprise Germanium (Ge). The then formed diodes are Ge-diodes. Ge-diodes may be particularly useful in applications that need high-speed operations, because the reaction time of Ge-diodes is relatively fast.

BRIEF DESCRIPTION OF THE DRAWINGS

Various aspects of the invention will be further explained with reference to embodiments shown in the drawings wherein:

FIGS. 3A and 3B schematically show a top view of different arrangements of electrodes within a beamlet blanker array;

FIG. 4 schematically shows a top view of another embodiment of electrodes within a beamlet blanker array;

DESCRIPTION OF ILLUSTRATIVE EMBODIMENTS

The following is a description of various embodiments of the invention, given by way of example only and with reference to the figures. The figures are not drawn to scale and merely intended for illustrative purposes.

The expression "interconnect structure" as used in the context of this application refers to a structure such as typically applied for integrated circuits with critical dimensions of 0.25 µm or smaller. It usually comprises from four up to ten levels of connection levels. The individual levels are mutually interconnected using vertical connections, also referred to as vias. An interconnect as discussed below may comprise a portion residing within one or more connection levels as well as comprise portions corresponding to one or more vias.

Figures 1, 2:
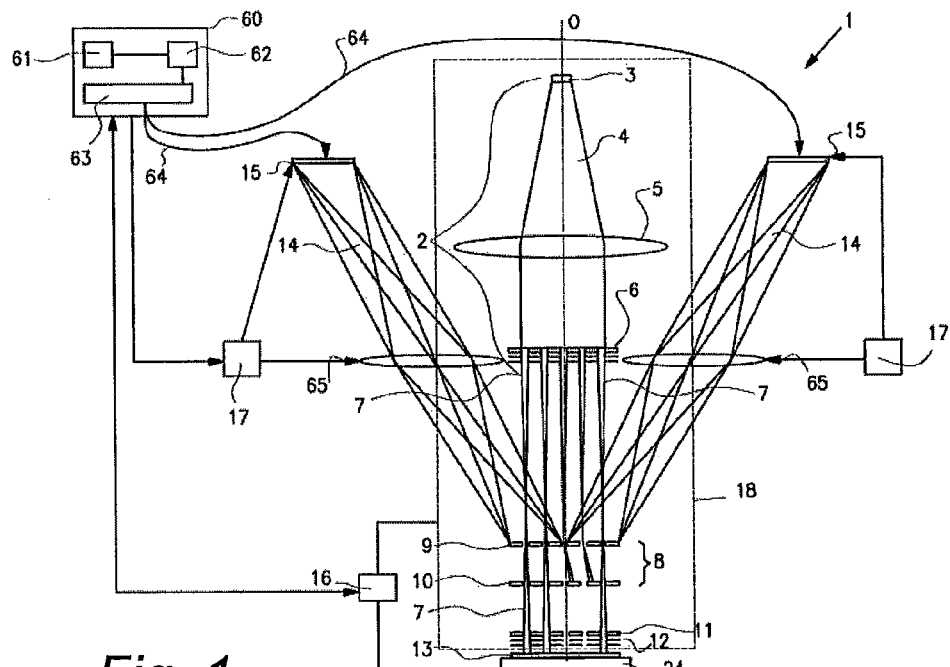
FIG. 1 schematically shows a maskless lithography system that may be used in embodiments of the inventions.
FIG. 2 schematically shows the operation of an embodiment of the beamlet blanker array in the lithography system of FIG. 1.

FIG. 1 shows a simplified schematic drawing of an embodiment of a charged particle multi-beamlet lithography system 1. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1, the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9.

The projector 65 may be appropriately aligned with the plate 15 by a projector positioning device 17 under control of the control unit 60. As a result, the distance between the projector 65 and the light sensitive elements within the beamlet blanker array 9 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam protector (not shown) may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures 35. For sake of reference the target 24 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Considering the shown beamlets 7a, 7b, 7c in FIG. 2, beamlets 7a, 7c have an incident angle extending between the beamlet and the optical axis O. The orientation of beamlet 7b is substantially parallel to the optical axis. The direction of beamlet deflection to establish blocking of deflected beamlets by the substrate of the beamlet stop array 10 may be different for each beamlet. Beamlet 7a is blocked by deflection towards the left, i.e. towards the "−"-direction in FIG. 2, indicated by dashed line 7a -. Beamlets 7b, 7c on the other hand are to be deflected towards the right, i.e. towards the "+"-direction, to established blocking of the respective beamlets. These blocking directions are indicated by dashed lines 7b+ and 7c+ respectively. Note that the choice of deflection direction may not be arbitrary. For example, for beamlet 7a, dashed line 7a+ shows that deflection of beamlet 7a towards the right would result in passage through the beamlet stop array 10. Therefore, deflection of beamlet 7a along line 7a+ would be inappropriate. On the other hand, deflection of beamlet 7b towards the left, indicated by dashed line 7b−, would be an option.

FIG. 3A schematically shows a top view of an arrangement of electrodes within a beamlet blanker array wherein the beamlet blanker array is arranged to converge groups of beamlets towards a common point of convergence. In this embodiment the beamlet blankers take the form of electrostatic modulators 30, each modulator 30 comprising a first electrode 32, a second electrode 34, and an aperture 35 extending through the body of the beamlet blanker array. The electrodes 32, 34 are located on opposing sides of the aperture 35 for generating an electric field across the aperture 35. The individual modulators 30 form a radial arrangement around a centrally located optical axis O. In the embodiment shown in FIG. 3A, both electrodes 32, 34 have a concave shape, which makes the shape of the electrodes 32, 34 conform to the cylindrical apertures 35. This cylindrical aperture shape is in itself suitable for preventing the introduction of certain optical aberrations, such as astigmatism.

In this embodiment, the electrodes 32, 34 of the individual modulators 30 are rotated, such that when deflected, the beamlets are still directed along lines converging to points of convergence on the optical axis. This deflection along radial lines extending from the optical axis turns out to be beneficial to prevent disturbance of other beamlets and/or any undesired passing of deflected beamlets through the beamlet stop array 10. In particular if the lateral distances between beamlets and also between groups of beamlets are small in comparison to the vertical distance between the beamlet blanker array 9 and the beamlet stop array 10, such disturbance and/or undesired passing can be significant. Although FIG. 3A suggests an area without modulators 30 in the vicinity of the optical axis O, that is not a necessary feature of this embodiment.

FIG. 3B shows an alternative arrangement of electrodes within a beamlet blanker array wherein the beamlet blanker array is arranged to converge groups of beamlets towards a common point of convergence. In this arrangement the individual modulators 30 do again form a radial arrangement around a centrally located optical axis O. However, the individual modulators 30 are not placed in concentric circles around the optical axis, but in an array formed by columns and rows with orientations substantially perpendicular to each other. Simultaneously, the electrodes 32, 34 of the individual modulators 30 do have an orientation such that they can deflect beamlets along radial lines extending from the optical axis O.

In particular when the beamlets passing through an electrode arrangement as shown in FIGS. 3A and 3B are arranged to be directed towards a single aperture within a beamlet stop array as shown in FIG. 2, the deflection directions are preferably such that beamlets that are to be blocked by the beamlet stop array are directed to blocking positions onto the beamlet stop array that are substantially homogeneously spread around the respective beam stop aperture. By evenly spreading the blocking positions of beamlets within a group of beamlets, degradation of the beam stop array by impingement of charged particles is spread as evenly as possible.

FIG. 4 schematically shows a top view of yet another embodiment of electrodes within a beamlet blanker array. In this embodiment, the electrodes 32, 34 are again situated around apertures 35, but the second electrodes 34 of several modulators 30 are integrated into a single strip. The modulators 30 are arranged in rows. An isolation zone 39 is suitably present between a first row 37 of modulators 30 and a second row 38 of modulators 30. The isolation zone 39 is designed to prevent undesired discharge.

In many applications the potential of the second electrode 34 is put at ground potential, i.e. 0V. However, the potential shared by the second electrodes 34 of several modulators 30 may also be set at a different potential, for example a reference voltage of about 1 kV or about −1 kV.

Figure 5:
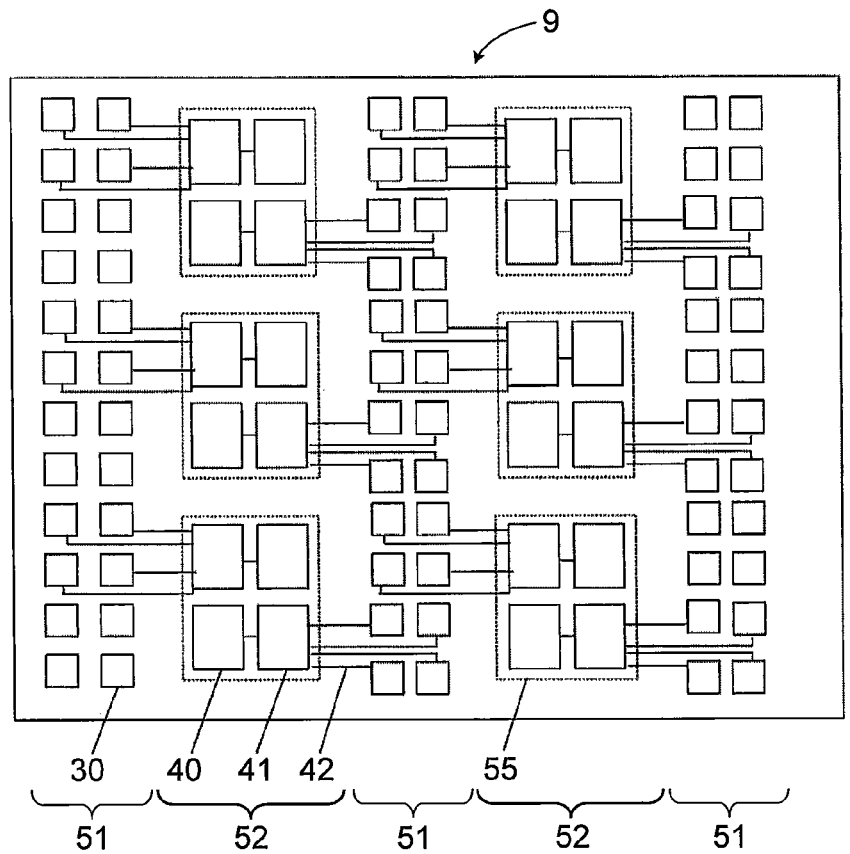
FIG. 5 schematically shows a top view of a topographic arrangement of components that may be used in a beamlet blanker array according to embodiments of the invention.

FIG. 5 schematically shows a top view of a topographic arrangement of components that may be used in a beamlet blanker array 9 according to embodiments of the invention. The beamlet blanker array is divided into beam areas 51 and non-beam areas 52. The beam areas 51 represent areas arranged to receive and modulate beamlets. The non-beam areas 52 are areas arranged to provide an area for components needed to support the components within the beam areas 51.

Components being present within the beam areas 51 include the modulators 30. The modulators 30 may take the form of electrostatic deflectors as discussed with reference to FIGS. 2-4.

Components within the non-beam areas 52 may include light sensitive elements 40 arranged to receive modulated light signals, for example in a way as discussed with reference to FIG. 1. Suitable examples of light sensitive elements 40 include but are not limited to photodiodes and phototransistors. The non-beam areas in the embodiment shown in FIG. 5 further include demultiplexers 41. The light signals received by the light sensitive elements 40 may be multiplexed signals to include information for more than one modulator 30. Therefore, after reception of the light signal by the light sensitive element 40, the light signal is transferred to a demultiplexer 41 where the signal is demultiplexed. After demultiplexing, the demultiplexed signals are forwarded to the correct modulators 30 via dedicated electrical connections 42.

As a result of the use of multiplexed light signals and an arrangement of light sensitive elements 40 and demultiplexers 41, the number of light sensitive elements 40 is lower than the number of modulators 30. Having a limited number of light sensitive elements 40 enables reduction of the dimensions of the non-beam areas 52. The beam areas 51 may then be placed more closely together to increase the number of modulators 30 per unit area in the blanker array. In comparison to the non-multiplexed embodiment, the lay-out of the beamlet blanker array would then be more compact if the same number of modulators would be used. If the dimensions of the blanker array would remain substantially the same, more modulators could be used. Alternatively, instead of decreasing the size of the non-beam areas 52 the use of the multiplexed embodiment could enable the use of light sensitive elements 40 with a greater light receiving area. The use of a greater light receiving area per light sensitive element 40 reduces the complexity of the optics needed to direct the light signals towards the correct light sensitive element 40 and makes the light receiving structure more robust.

Figure 6:
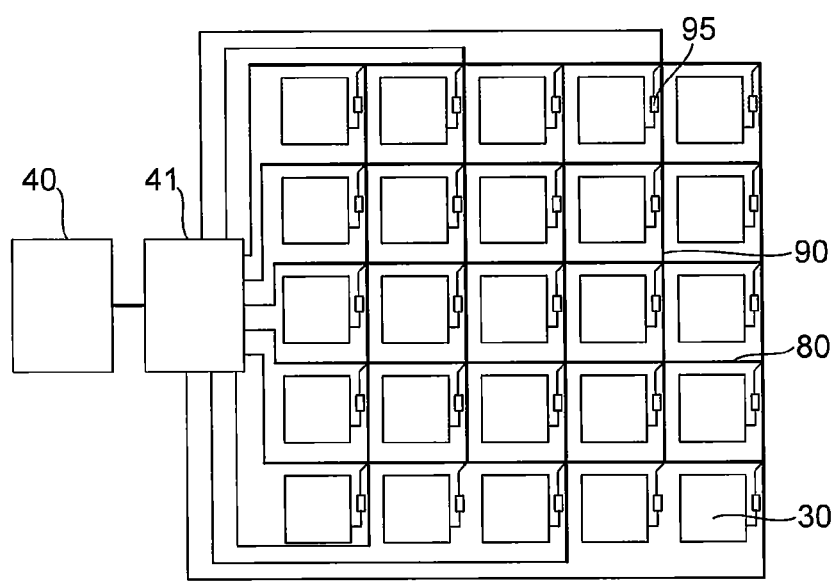
FIG. 6 schematically shows a top view of a topographic arrangement with an addressable array of wordlines and bitlines that may be used in embodiments of the invention.

The modulators 30 may be suitably arranged in columns and rows to allow addressing via wordlines 80 and bitlines 90 as shown in FIG. 6. Such arraywise addressing reduces the number of connections extending from the demultiplexer 41 to the modulators 30. For example, in FIG. 6 only 10 connection lines are present, while individual addressing would result in 25 connection lines to address the 25 modulators 30. Such reduction of connection lines improves the reliability of the beamlet blanker array 9 as it becomes less susceptible to failure due to a malfunctioning connection between a demultiplexer 41 and a modulator 30. Furthermore, the connections may occupy less space if placed in such arraywise addressing arrangement.

While the embodiment in FIG. 5 shows four deflectors 30 per light sensitive element 40, and FIG. 6 shows 25 deflectors 30 per light sensitive element 40, a ratio between deflectors 30 and light sensitive elements 40 may be increased up to 100 or even more, for example 250. The advantage of the reduction of connections between demultiplexers 41 and corresponding modulators 30 then becomes significant in that the robustness and reliability of the beamlet blanker array 9 improves considerably.

Suitably, the demultiplexers 41 may be moved towards the beam-area 51 to shorten the connections with the respective modulators 30. This is particularly useful when the distance between light sensitive elements 40 and the deflectors 30 is relatively large, for example in the order of 100 micrometer or more.

In order to ensure that the modulators 30 deflect a passing beamlet during a full deflection period, the beam area 51 may further include memory elements 95 coupled to respective modulators 30 for temporarily storing a control signal dedicated for the respective modulator 30 for a predetermined period of time. The predetermined period of time may correspond to or be larger than the full deflection period to ensure that the control signal is available for such entire deflection period. This arrangement allows the deflection step to be independent from the transmission of control signals time wise. Furthermore, the transmission of control signals may thus be done sequentially, whereas the deflection of beamlets is performed simultaneously.

Figure 7:
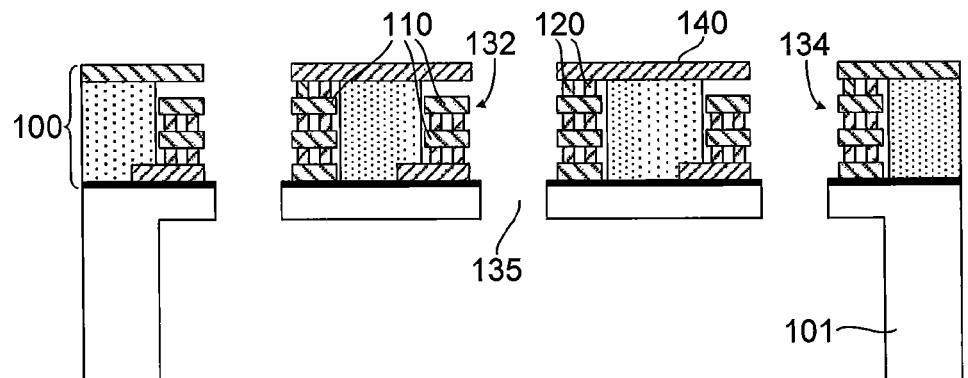
FIG. 7 schematically shows a cross-sectional view of a beamlet blanker array according to an embodiment of the invention.

FIG. 7 schematically shows a cross-sectional view of a portion of a beamlet blanker array or modulation device according to an embodiment of the invention. Though not shown, it will be understood that the blanker array extends in two dimensions (in a direction into and out from the page in FIG. 7), for instance in accordance with the division of the beamlet blanker array into beam areas and non-beam areas as schematically shown in FIG. 5.

The array 9 comprises a body comprising an interconnect structure 100. The interconnect structure 100 is provided with a plurality of modulators. The interconnect structure 100 provides different connection levels that enable connection of the modulators to one or more pattern data receiving elements, for example the light sensitive elements 40 shown in FIGS. 5 and 6. The connection between a modulator and a pattern data receiving element is referred to as "interconnect".

Each modulator comprises a first electrode 132, a second electrode 134, and an aperture 135 extending through the body. The electrodes 132, 134 are located on opposing sides of the aperture 135 for generating an electric field across the aperture 135. The electrodes 132, 134 are formed by conductive elements 110 at different levels of the interconnect structure 100, where the conductive elements 110 are connected with each other by one or more vias 120.

The interconnect structure 100 may be supported by a substrate 101, for example a silicon substrate, for enhancing the structural integrity of the beamlet blanker array. The use of electrodes 132, 134 formed by conductive elements 110 at different levels connected by vias 120 has the advantage that the beamlet blanker array can be produced with known semiconductor techniques, for example techniques used in CMOS-technology, where CMOS stands for Complementary Metal-Oxide Semiconductor. Furthermore, the use of conductive elements 110 at multiple levels enables connection of modulators to pattern data receiving elements such as the light sensitive elements described earlier at different levels. For example, in an arrangement as shown in FIG. 6, wordlines may connect to the electrodes at a different level within the interconnect structure than bitlines. Consequently, the density of connection lines per unit area of the beamlet blanker array may improve, which provides the opportunity to place the modulators at a closer pitch than would be possible if all connections were to be located within the same level.

The top layer 140 of the body may be used to define a shield. The shield may be set at the same potential as the second electrode 134, which may act as a ground electrode. The shield serves the purpose of preventing cross-talk between neighboring modulators.

As mentioned above, the interconnect structure 100 may use techniques typically applied for integrated circuits with critical dimensions of 0.25 µm or smaller. In some of these techniques, for example CMOS, the structure usually comprises 4-10 levels for interconnection purposes. The individual levels are mutually interconnected using vertical interconnect areas or vias. The layer thickness of an individual level is typically about 1 µm. In a type of interconnect structure that can be used in embodiments of the invention, the interconnect structure comprises copper (Cu) levels and Cu vias made using so-called dual damascene technology. In another type of interconnect structure that may be used, the interconnect structure comprises Aluminum (Al) levels and Tungsten (W) vias. The materials being used may be optimized with alloying elements.

Additionally, as will be known to the skilled person, barrier layers may be used. Such barrier layer is in particular useful in cases where Cu is used in the interconnect structure. Cu tends to migrate very easily and may contaminate the structure. Al is less susceptible to migration due to the formation of native oxide on an exposed Al-surface. However, the thickness of this native oxide layer is generally rather thin, and a barrier layer may be used to improve the performance of the interconnect structure. A barrier layer may comprise materials selected from the group of materials consisting of TiN, TaN, and TiW. To obtain the desired functionality, each of the levels within the interconnect structure typically has its own different pattern. The top of the interconnect structure may be covered with a passivation layer to protect the interconnect structure against moisture and contamination. Bond pads for providing electrical contacts of the interconnect structure with exterior elements may be defined in the most upper metallization level or even on top of the passivation layer. The bond pads may be suitable for wire bonding or solder bumping. Furthermore, the top side of the interconnect structure may be suitably provided with a metallized surface to avoid local charging and attraction of charged particles, for example electrons.

Note that although the orientation shown in FIG. 7 may imply otherwise, the charged particle beamlets may pass through the apertures 135 downwards as well as upwards. The actual orientation of the array 9 may depend on available space and other constraints caused by other components in the charged particle multi-beamlet lithography system.

FIGS. 8A-8F schematically show a cross-sectional view of steps in the manufacturing of the beamlet blanker array 9 of FIG. 7.

Figure 8A:
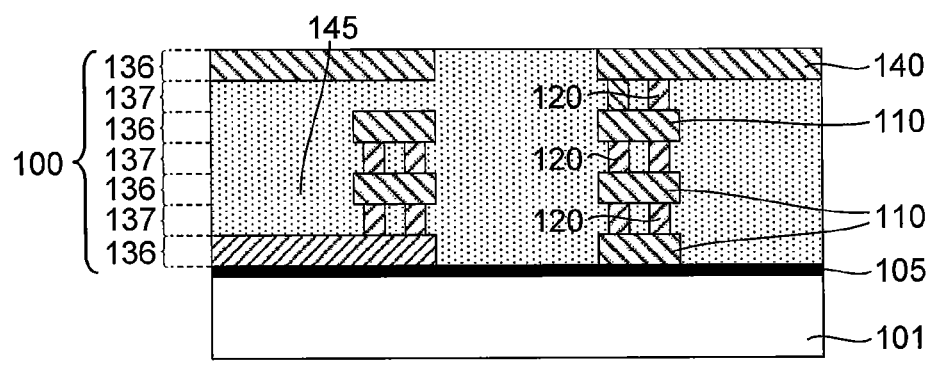
FIGS. 8A-8F schematically show a cross-sectional view of steps in the manufacturing of a portion of the beamlet blanker array of FIG. 7.

FIG. 8A shows a first stage in the manufacturing, which includes providing a body comprising an interconnect structure 100. The interconnect structure comprises a stack of layers defining a stack of levels 136, 137. Each level may include one or more layers. Layers used for making connections between structures within such layer are defined as being part of a metallization level 136. Layers arranged to enable connections between different layers within the stack are defined as being part of a via level 137. The interconnect structure 100 is provided with a plurality of modulators and interconnects at different levels within the interconnect structure. The interconnects enable connection of the modulators to one or more pattern data receiving elements, for example the light sensitive elements 40 discussed with reference to FIG. 5.

The body generally includes a supporting substrate 101 for improving the structural integrity and to provide further electrical switching and connection capabilities. For this reason, active elements such as transistors, diodes and capacitors may be defined suitably within the substrate 101. The substrate 101 typically comprises silicon, or silicon-on-insulator, or another modified silicon substrate, such as SiGe.

The substrate surface facing the interconnect structure may be covered by a dielectric layer 105 for preventing diffusion into the substrate 101. The dielectric layer 105 may in such case be provided with LOCOS (Local oxidation of Silicon) or STI (Shallow trench insulation), or any other suitable technique known to a person skilled in the art.

On top of the substrate 101 and optional thermal oxide layer 105, the multilevel interconnect structure 100 is defined. The interconnect structure 100 comprises multiple layers, typically arranged in such a way that metallization levels 136 are coupled to each other by via levels 137. In the different levels, conductive structures are present in accordance with a predetermined pattern surrounded by insulating material 145. The conductive structures in a metallization level 136 typically take the form of connecting structures, e.g. wires, while the conductive structures in a via level 137 typically take the form of a so-called contact hole or via.

The pattern of conductive material within the metallization levels and position and number of vias correspond, at least at some locations within the interconnect structure, to the desired pattern of modulators to be formed. For this purpose, aperture areas 135 are kept free of metal structures and filled with insulating material 145. Additionally, conductive elements 110 are placed circumferentially around the aperture area 135 within one or more metallization levels and suitably connected to each other via vias 120 in the via levels.

The metal used in the metallization levels 136, for example for conductive elements 110, typically comprises Aluminum (Al). Additionally, or alternatively, the metal may comprise Copper (Cu). A typical material used for the vias 120 is Bismuth (W) or Cu manufactured in a so-called dual damascene manufacturing process. The insulating material 145 being used typically comprises silicon dioxide ($SiO_2$).

Although not shown, the interconnect structure 100 may be suitably covered with a passivation layer for protecting the structure. For use in an application for charged particle lithography, such passivation layer is preferably covered with a conductive coating to avoid any undesired buildup of charge within the system.

The body can be manufactured using known semiconductor processing techniques, for example techniques to produce a CMOS-chip. The use of known semiconductor processing techniques to provide a basic building block of the beamlet blanker array significantly reduces the costs of manufacturing. Furthermore, the use of such body improves the reliability of the beamlet blanker array manufactured in accordance with the process of manufacturing described below.

Figure 8B:
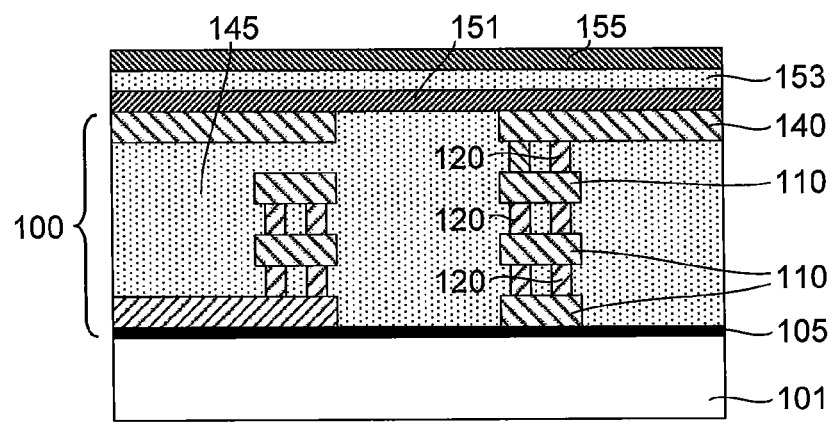

After providing the body, the interconnect structure 100 may be covered by three layers, i.e. a first resist layer 151, an insulating layer 153, and a second resist layer 155. The end result after this step is shown in FIG. 8B.

The first resist layer 151 typically is a photo-resist layer. The second resist layer 155 typically is an electron-beam resist layer. The insulating layer 153 typically comprises $SiO_2$. The resist layers 151, 155 may be deposited by means of spinning The insulating layer 153 may be deposited by sputtering.

Figure 8C:
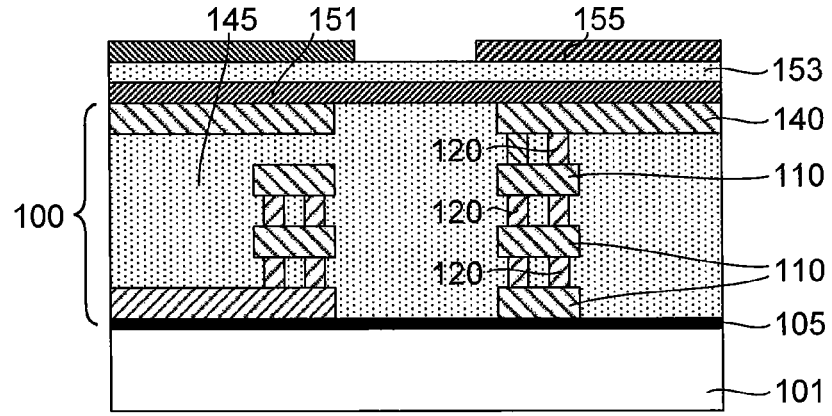
Figure 8D:
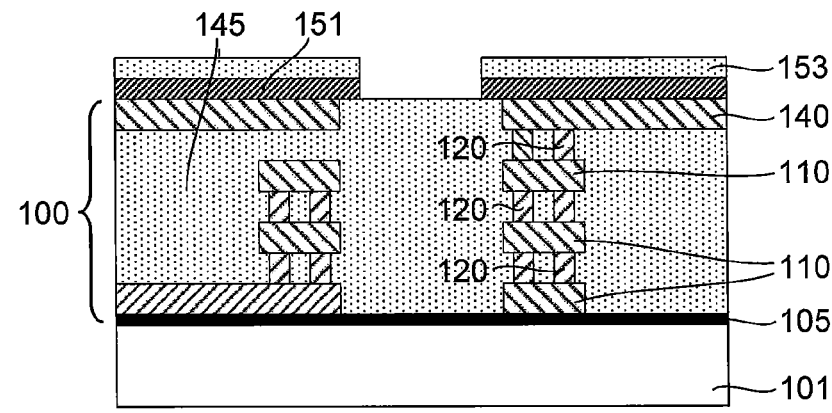

The second resist layer 155 is then exposed in accordance with a pattern, and subsequently developed to obtain the structure shown in FIG. 8C. Partial exposure in accordance with a pattern may be done with an electron beam pattern generator, where the second resist layer 155 comprises an electron beam resist. Alternatively, in case the second resist layer 155 would be a photo-resist, exposure by means of a pattern could be executed with a suitable light source in combination with a mask as will be understood by a person skilled in the art.

The patterned second resist layer 155 is now used as an etch mask for the insulating layer 153. The etched insulating layer 153 may then be used as an etch mask for etching the first resist layer 151. The etching may include inductively coupled plasma (ICP) etching using a suitable plasma, for example a fluorine plasma and/or an oxygen plasma. During the etching of the first resist layer 151, the second resist layer 155 may be consumed. The end result of the process steps described above is schematically shown in FIG. 8D.

Figure 8E:
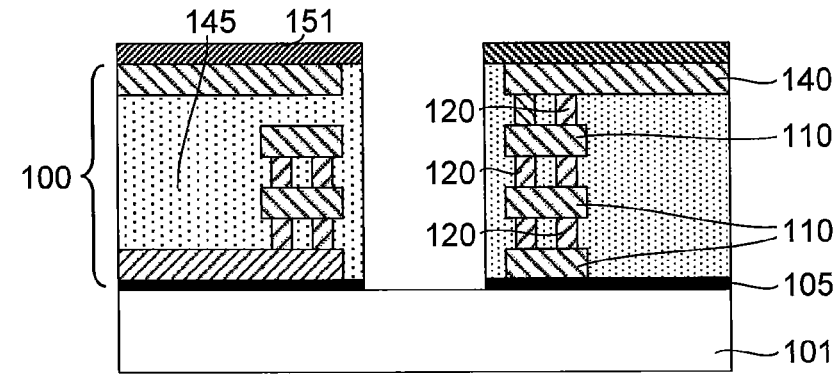

Next, the first resist layer 151 is used as an etch mask for removal of insulating material. The etching may again include ICP etching in a suitable plasma, e.g. a fluorine plasma. A result of this etching step is shown in FIG. 8E.

Subsequently, holes 160 are etched into the substrate 101, preferably by using an anisotropic etching technique. A suitable etching technique is so-called Bosch-etching, in particular if the substrate is a silicon substrate. Bosch etching is method of anisotropic etching by cyclic etch and deposition steps in a plasma environment and described in more detail with respect to the etching of silicon in German patent DE4241045 and U.S. Pat. No. 5,501,893. Other materials such as GaAs, Ge, and SiGe can be etched in a similar way.

Figure 8F:
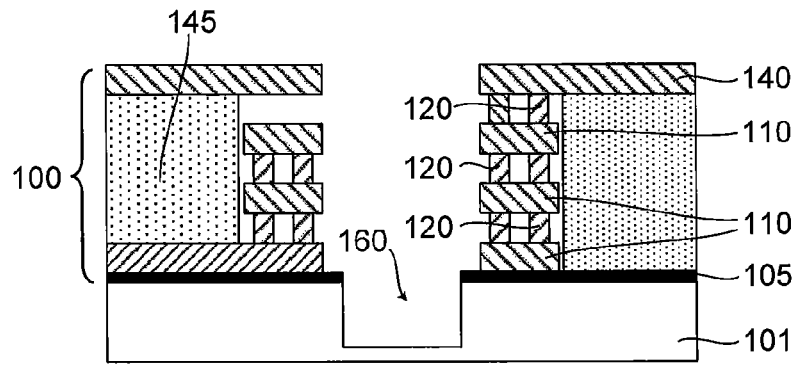

Additionally, a chemically selective etching technique may be used to widen the free space in the interconnect structure 100 by removing insulating material while leaving the metal structures substantially intact. A suitable chemically selective etching technique includes wet etching. As a result of the widening of the free space within the interconnect structure 100 the conductive elements 110 in the different metallization levels may be exposed, as well as one or more of the vias 120 in the via levels. A result of the abovementioned etching steps is schematically shown in FIG. 8F.

Exposure of the conductive elements 110 in the metallization levels, and preferably also at least one via 120 in the one or more via levels improves performance of the electrodes 132, 134 of the modulator. The electric field as provided by the electrodes 132, 134 across the aperture 135 may be more uniform. Furthermore, the removal of insulating material 145 that may face electron beamlets during use, prevents charging of this material during use by scattered charged particles such as electrons. Charge buildup within apertures of the beamlet blanker array tends to reduce performance over time and is therefore undesired.

Although the structure shown in FIG. 8E suggests that removal of insulating material 145 is needed to expose side faces of the conductive elements 110, exposure of one or more of these side faces may already have been achieved in an earlier etching step.

Although not indicated in the Figures, at least the exposed surfaces of the conductive elements 110, and preferably also the one or more vias 120 that are exposed to the inner volume of the aperture 135, may be provided with a substantially inert conductive coating, e.g. a coating of a material that does not or not substantially oxidize. Examples of such coatings include but are not limited to coatings of CrMo, Au, and Pt.

Figure 9A:
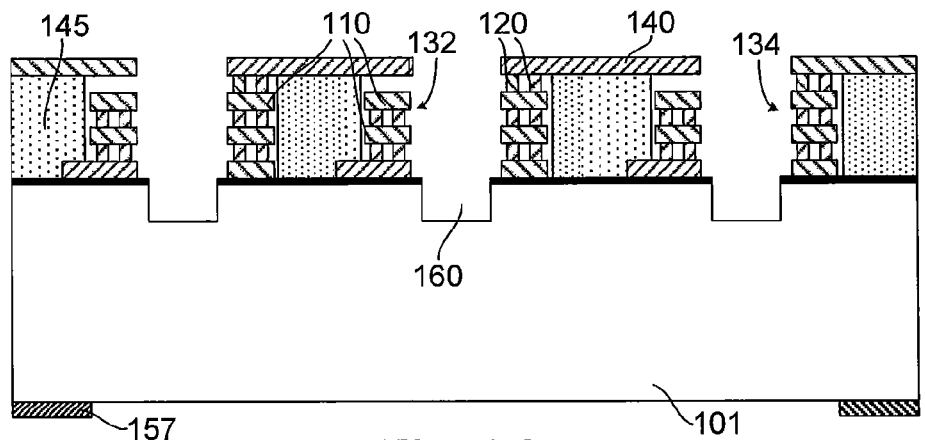
FIGS. 9A-9B schematically show a cross-sectional view of further steps in the manufacturing of the blanker arrangement of FIG. 7.
Figure 9B:
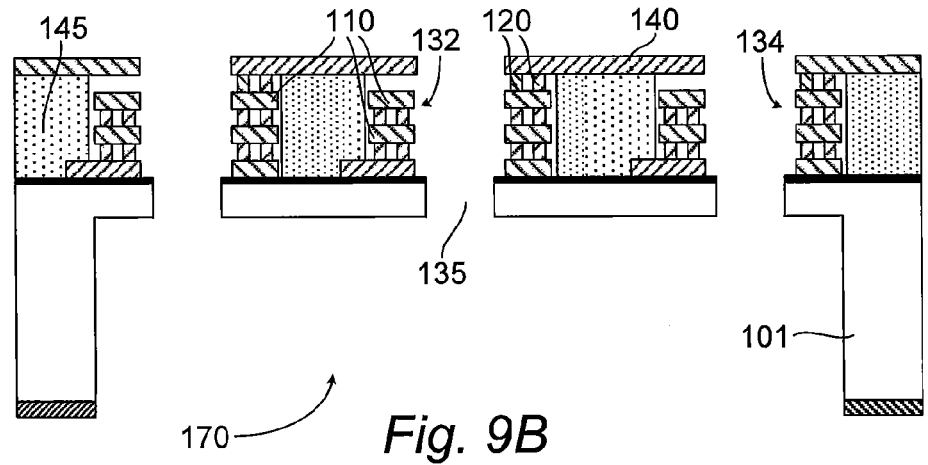

In order to depict the further processing steps, a cross-sectional view of a larger portion of the beamlet blanker array is provided in FIGS. 9A, 9B. In this case, the cross-sectional view includes three apertures 135 as discussed with reference to FIGS. 8A-8F.

After the chemically selective step used to widen the free space within the interconnect structure 100 and the etching of holes 160 in the substrate 101, a large aperture 170 is formed into the semiconductor substrate 101 by etching from the side facing away from the interconnect structure 100, i.e. the "backside". For this etching a third resist layer 157 is selectively deposited on the backside of the substrate 101 (see FIG. 9A). The third resist layer 157 is then used as an etch mask for the etching which leads to the result shown in FIG. 9B. Subsequent removal of the third resist layer 157 would lead to the beamlet blanker array portion shown in FIG. 7. For the backside etching use can be made of dry etching, for example reactive ion etching (RIE), or wet etching as known to a skilled person in the art.

Note that the step of chemically selective removal of insulating material so as to expose conductive material to the aperture is not necessarily performed after etching one or more holes 160 in the semiconductor substrate 101, but may also be applied after the back-etching step discussed with reference to FIGS. 9A, 9B.

Furthermore, although the back-etching step discussed with reference to FIGS. 9A, 9B creates an aperture from the backside with dimensions sufficient to define through holes through the entire structure for more than one modulator, it is to be understood that such back-etch aperture may be arranged per modulator as well. The advantage of using a single backside aperture for multiple modulators is that it simplifies manufacturing due to a lower complexity of the mask being used in the backside etching step, and lower alignment requirements.

Figure 10:
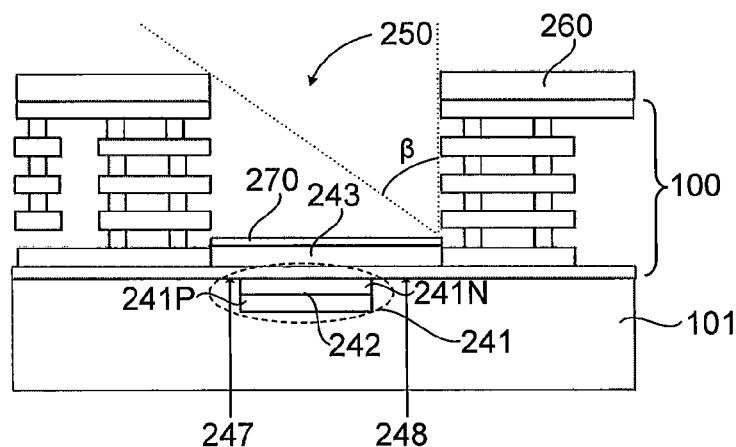
FIG. 10 schematically shows a cross-sectional view of a blanker arrangement including a shield.

FIG. 10 shows a simplified, cross-sectional view of another portion of the beamlet blanker array. In particular, FIG. 10 schematically depicts a portion of the beamlet blanker array comprising a light sensitive element. In the shown embodiment the light sensitive element comprises a diode 241 having a first and second zone 241P, 241N and a junction 242 between those zones 241N, 241P. An antireflection coating 243 is present on top of the diode 241. Such antireflection coating 243 is arranged to prevent reduction of light intensity due to reflections.

In the shown embodiment, the interconnect structure 100 has been removed on top of the diode 241 to create a cavity 250. Such removal can be performed by etching after completion of the interconnect structure 100. Alternatively, the cavity 250 may be created during the etching step carried out to obtain the structure shown in FIG. 8E. The antireflection coating 243 may be deposited before creation of the cavity 250. By choosing a selective etchant and/or provided the coating with a suitable and optically transparent etch stop layer, the coating 243 will not be removed in an etching step. Alternatively, the antireflection coating 243 may be deposited later, i.e. after creation of the cavity 250.

As shown in the embodiment of FIG. 10, an additional electrically conductive layer 260 may be added to the interconnect structure 100. Such additional interconnect layer 260 may serve as a so-called redistribution layer and/or a bump metallization layer as will be known to a person skilled in the art of chip scale packaging. In some embodiments, the additional interconnect layer 260 comprises two sublayers, i.e. a bottom passivation layer and a top conductive layer. The passivation layer is arranged to protect the interconnect structure 100 against damages caused by exterior influences, for example further mechanical handling of the body during manufacturing. The top conductive layer may be used to enable conductive connections with other structures. Furthermore, in particular when the top conductive layer is sputtered on top of the body after all processing steps, the top conductive layer may cover insulating particles that are roaming through the system. The coverage of such insulating particles reduces the number of stray field sources within the system.

In another suitable implementation, a first and a second border area 247, 248 are present laterally between the photodiode 41 and the interconnect structure 100. The first border area 247 is herein present at a side towards the not-shown deflector. The first border area 247 is herein smaller than the second border area 248. This embodiment allows for a transmission of light beam with incident angles somewhat smaller than exactly 90 degrees.

The provision of the light sensitive element within a cavity 250 as shown in FIG. 10 is particularly suitable for light sensitive elements with a diameter that is smaller or comparable to the height of the cavity 250. In this case, the side faces of the cavity 250 effectively block an electric field originating from the light sensitive element, and particularly the antireflection coating 243. This field is due to collection of scattered charge particles. The tangent of angle β is equal to the ratio of diameter and height of the cavity. Suitably, the angle β is larger than about 45 degrees, more suitably larger than about 60 degrees.

If a light sensitive element starts to act as a source of charged particles this may disturb a clean passage of one or more proximate beamlets (not shown in FIG. 10). Leaving out the antireflection coating 243 may reduce this undesired effect. The antireflection coating 243 is generally made of or predominantly comprises an insulating material, in which scattered charged particles may be collected relatively easily. However, leaving out the antireflection coating 243 would reduce the efficiency of light incoupling. In particular if the amount of data to be optically transmitted is designed to be large—it may be in the order of 100 MBit/s per deflector—light incoupling efficiency is important. A high efficiency enables the transmission of light beams that are modulated with a high frequency, for instance at a frequency above 10 MHz, preferably above 100 MHz and suitably above 1 GHz.

In the embodiment shown in FIG. 10, an optically transparent, electrically conductive coating 270 is present on top of the antireflection coating to act as a beam protector. Such coating 270 may be used instead or in addition to other embodiments of beam protectors some of which will be described hereafter. The provision of the conductive coating 270 within the cavity 250 can be done in ways known to a person skilled in the art. For example, one may pattern the antireflection coating 243 and the conductive coating 270 in a single step. Alternatively, the conductive coating 270 may be provided with a suitable printing process. The conductive coating 270 may comprise materials selected from the group of materials consisting of indium-tin-oxide (ITO), and a conductive polymer, such as poly-3,4-ethylenedioxythiophene (PEDOT), combined with a polyacid.

The diode 241 shown in FIG. 10 typically is a diode formed in the supporting substrate 101 by suitable doping to obtain the doped regions 241P, 241N. Typically, the substrate 101 predominantly contains silicon, and the diode 241 is referred to as a silicon diode. The reaction time of silicon diodes may be too slow for some applications that are in need of high-speed operations. Therefore, in particular for higher speed applications, Ge-diodes are preferably used. The Ge-diodes do not have to be integrated in the supporting substrate 101. Instead, they may be formed by bonding a Ge-plate on top of the interconnect structure 100, for example by using anodic bonding. The bonding may be executed by depositing an intermediate insulating layer, for example a silicon dioxide layer, on top of the interconnect structure 100 followed by a suitable polishing step to obtain a substantially flat surface. The substantially flat surface then serves the purpose of receiving the Ge-plate for bonding. After bonding the Ge-plate, the plate can be suitably patterned to obtain diodes, hereinafter referred to as Ge-diodes, at predetermined locations. Note that Ge-diodes formed in this way are not residing in a cavity 250 as is the case for the Si-diode 241 in FIG. 10. Electric fields originating from the Ge-diodes are therefore not substantially blocked by the interconnect structure 100. For these embodiments, the use of a beam protector may be desirable. Embodiments of such a beam protector will be described with reference to FIGS. 11, 12 and 13.

As mentioned earlier, embodiments of the structure may be provided with a beam protector. Such beam protector may take the form of a plate assemble substantially parallel to the substrate 101 of the beamlet blanker array 9. Alternatively, it may be embodied as a side wall extending from such plate. Different embodiments of beam protectors will be discussed with reference to FIGS. 11-13.

Figure 11:
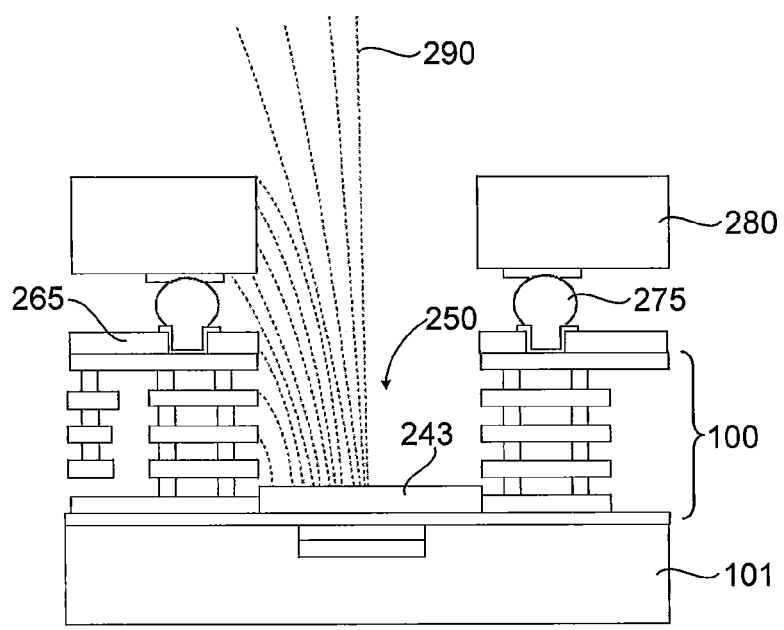
FIG. 11 schematically shows a cross-sectional view of another blanker arrangement including a shield.

FIG. 11 shows a further embodiment of the structure shown in FIG. 10. In the embodiment of FIG. 11, a body 280 is assembled to the interconnect structure 100. Use is made of solder balls 275 for the assembly. The solder balls 275 extend through a passivation layer 265 commonly used in IC manufacturing. The body 280 is suitably used as a beam protector, so as to block the electric field originating from the light sensitive element. An exemplary orientation of field lines 290 representing such electric field is shown in FIG. 11 as well.

Figure 12:
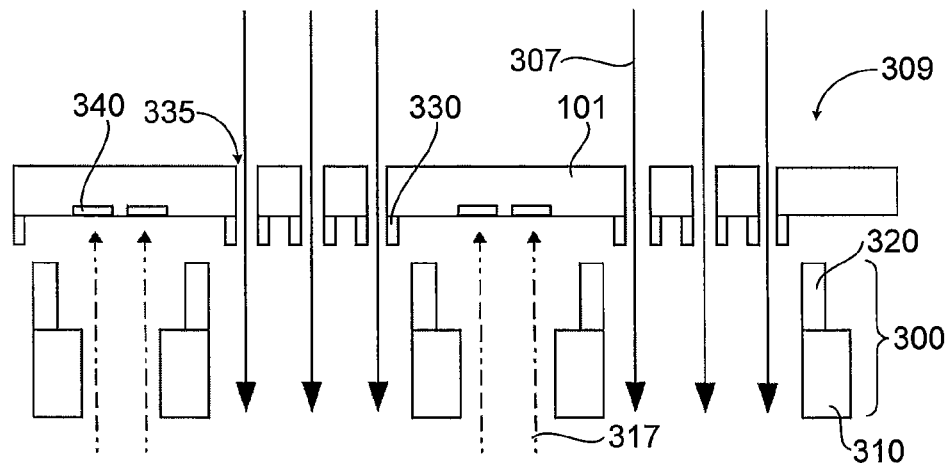
FIG. 12 schematically shows a cross-sectional view of an embodiment of the blanker arrangement assembled with a beam protector.

FIG. 12 shows a schematic cross-sectional view of a beamlet blanker array 309 with beam protector 300. The beamlet blanker array 309 may be subdivided into beam areas and non-beam areas, as schematically shown in FIG. 5. The non-beam areas herein comprise a plurality of light sensitive elements 340 arranged to receive light beams 317. The beam areas include a plurality of mutually adjacent deflectors 330. The light beams 317, indicated herein with dashed-dotted arrows have an incident angle of approximately 90 degrees. Note that this is not essential.

The embodiment of the beam protector 300 shown in FIG. 12 includes a substrate 310 provided with side walls 320 extending thereon. The side walls 320 are located on the substrate 310 adjacent to an aperture 335 with is aligned with the trajectories of the beamlets 307. Note that although the beamlets 307 in FIG. 12 pass the beamlet array 309 perpendicularly, this is not essential.

The side walls 320 are suitably made of conductive material. In some embodiments, a side wall 320 is arranged circumferentially around an aperture 335. In some other embodiments, a side wall 320 is arranged circumferentially around a lateral area defined by the one or more light sensitive elements 340. In such case, a structure of side walls 320 may be provided, including a side wall extending around the lateral area of light sensitive elements and a side wall extending around the aperture 335.

Figure 13:
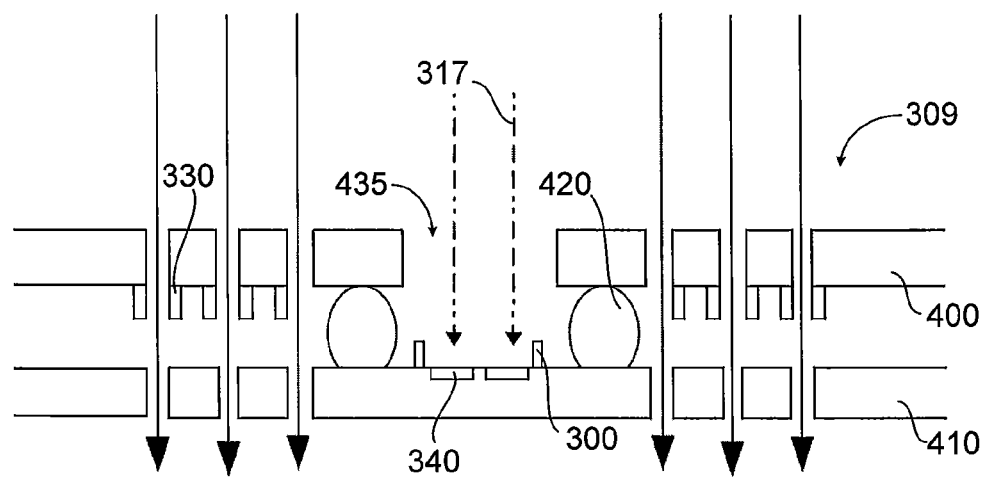
FIG. 13 schematically shows a cross-sectional view of an alternative embodiment of the blanker arrangement assembled with a beam protector.

FIG. 13 shows yet another embodiment of a beamlet blanker arrangement 309 with a beam protector 300. The beamlet blanker arrangement 309 of this embodiment comprises a first substrate 400 and a second substrate 410. The deflectors 330 are defined on the first substrate 400. The light sensitive elements 340 are defined at a surface of the second substrate 410. Solder balls 420 or other types of connectors provide mechanical connections from the first substrate 400 to the second substrate 410 and electrical connections between the light sensitive elements 340 and the deflectors 330, and/or any intermediate circuitry. Light beams 317 arrive now at the light sensitive elements 340 from an opposite direction, e.g. the top side of the column. Thereto, radiation apertures 435 are present in the first substrate 400. A beam protector 300 is embodied as a side wall extending circumferentially around the plurality of light sensitive elements 340.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A modulation device for use in a charged particle multi-beamlet lithography system, the device comprising a body comprising an interconnect structure comprising multiple metallization levels separated by via levels, each metallization level including one or more layers for making electrical connections within the one or more layers of the metallization level, and each via level comprising one or more layers provided with one or more interconnect areas, also referred to as vias, for mutually electrically connecting adjacent metallization layers, the interconnect structure further being provided with a plurality of modulators and interconnects at different levels within the interconnect structure for enabling connection of the modulators to one or more pattern data receiving elements;

wherein a modulator comprises a first electrode, a second electrode, and an aperture extending through the body of the interconnect structure, the electrodes being located on opposing sides of the aperture for generating an electric field across the aperture;

wherein at least one of the first electrode and the second electrode comprises a first conductive element formed at a first metallization level of the multiple metallization levels of the interconnect structure, a second conductive element formed at a second metallization level of the multiple metallization levels of the interconnect structure and a third conductive element formed at a third metallization level of the multiple metallization levels of the interconnect structure, the first, second and third metallization level being different metallization levels, and the first, second and third conductive elements being electrically connected with each other so that the at least one of the first electrode and the second electrode extends over more than two metallization levels of the multiple levels of the interconnect structure; and wherein the first, second and third conductive elements are exposed to the aperture so as to form part of the electrode.

2. The modulation device of claim 1, wherein the first and second conductive elements are electrically connected with each other by at least one via in a via level between the first metallization level and the second metallization level, the at least one via is being exposed to the aperture so as to form part of the electrode.

3. The modulation device of claim 1, wherein a first modulator of the plurality of modulators is arranged to connect to a pattern data receiving element via the first conductive element at the first metallization level of the interconnect structure, and a second modulator of the plurality of modulators is arranged to connect to the pattern data receiving element via the second conductive element at the second metallization level of the interconnect structure.

4. The modulation device of claim 1, wherein the interconnects of the plurality of modulators are arranged in an addressable array, the addressable array being provided with at least one wordline and at least one bitline.

5. The modulation device of claim 1, wherein the interconnect structure is supported by a substrate.

6. The modulation device of claim 5, wherein the substrate is a semiconductor substrate in which a plurality of semiconductor circuitry elements is defined.

7. The modulation device of claim 1, wherein a top layer of the interconnect structure is a conductive layer.

8. The modulation device of claim 7, wherein the top layer is arranged to be at ground potential, wherein the first electrode is arranged for connection with the pattern data receiving element, and wherein the second electrode is connected to the top layer.

9. The modulation device of claim 1, wherein the interconnect structure is a CMOS-structure.

10. The modulation device of claim 1, wherein the data receiving elements are part of the modulation device, and the data receiving elements are light sensitive elements for converting light signals into corresponding electric signals.

11. The modulation device of claim 10, wherein the light sensitive elements are Ge-diodes provided on top of the interconnect structure.

12. A charged particle multi-beamlet lithography system for transferring a pattern onto the surface of a target using a plurality of beamlets, the system comprising:
a beam generator for generating a plurality of beamlets;
a modulation device according to claim 1 for deflecting the plurality of beamlets in accordance with pattern data;
a beamlet stop array for selectively blocking the deflected beamlets so as to form patterned beamlets; and
a projection system for projecting the patterned beamlets onto the target surface.

13. The lithography system of claim 12, wherein the beamlet stop array comprises a plurality of apertures, the number of the plurality of apertures being smaller than the number of the plurality of beamlets so that a group of beamlets is arranged to pass through a single aperture in the beamlet stop array, and
wherein the modulation device comprises a plurality of deflectors, one or more deflectors corresponding to an aperture of the beamlet stop array, the deflectors being— arranged to deflect the beamlets towards blocking positions onto the beamlet stop array such that the blocking positions are substantially homogeneously spread around the single aperture.

14. A method of manufacturing a modulation device comprising:
providing a body comprising an interconnect structure comprising multiple metallization levels separated by via levels, each metallization level including one or more layers for making electrical connections within the one or more layers of the metallization level, and each via level comprising one or more layers provided with one or more interconnect areas, also referred to as vias, for mutually electrically connecting adjacent metallization layers, the interconnect structure further being provided with a plurality of modulators and interconnects at different levels within the interconnect structure for enabling connection provided with a plurality of modulators and interconnects at different levels within the interconnect structure for enabling connection of the modulators to one or more pattern data receiving elements, wherein a modulator comprises a first electrode, and a second electrode, and wherein at least one of the first electrode and the second electrode comprises a first conductive element formed at a first metallization level of the multiple metallization levels of the interconnect structure-and ~ a second conductive element formed at a second metallization level of the multiple metallization levels of the interconnect structure and a third conductive element formed at a third metallization level of the multiple metallization levels of the interconnect structure, the first, second and third metallization level being different from the first metallization levels, and the first, and~ second and third conductive elements being electrically connected with each other so that the at least one of the first electrode and the second electrode extends over more than one two metallization levels of the multiple levels of the interconnect structure; and
forming apertures extending through the body of the interconnect structure such that the first electrode and the second electrode of a modulator of the plurality of modulators are located on opposing sides of the aperture for generating an electric field across the aperture, and wherein the first, second and third conductive elements are exposed to the aperture so as to form part of the electrode.

15. The method of claim 14, wherein the forming of apertures includes:
depositing a first resist layer;
depositing an insulating layer on top of the first resist layer;
depositing a second resist layer on top of the first resist layer;
exposing the second resist layer in accordance with a pattern such that the second resist layer can be removed on top of locations where apertures are to be formed, and selectively removing the second resist layer in accordance with the pattern;
etching the insulating layer using the second resist layer as first etch mask;
etching the first resist layer using the etched insulating layer as a second etch mask; and
etching the body using the etched first resist layer as a third etch mask so as to form the apertures.

16. The method of claim 14, wherein the forming of apertures includes chemically selective etching of insulating material so as to expose at least one of a surface of the first electrode, a surface of the second electrode and a via used for connecting conductive elements within one of the electrodes.

17. The method of claim 16, wherein chemically selective etching includes wet etching.

18. The method of claim 14, wherein the body further comprises a substrate for supporting the interconnect structure, and wherein forming apertures comprises a step of etching holes in the substrate.

19. The method of claim 18, wherein etching holes comprises anisotropic etching using a Bosch process.

20. The method of claim 14, wherein the pattern data receiving elements are diodes for converting light signals into electric signals, and the method further comprises:
bonding a plate of diode material onto the interconnect structure;
patterning the plate to obtain diodes at predetermined locations.

21. The method of claim 20, wherein the plate comprising Germanium.

22. The modulation device of claim 1, wherein the at least one of the first electrode and the second electrode is formed by conductive elements at different metallization levels of the multiple metallization levels of the interconnect structure, the conductive elements being electrically connected to each other by one or more vias in in between via levels, wherein the conductive elements of the at least one of the first electrode and the second electrode are exposed to an inner volume of the corresponding aperture.

23. The modulation device of claim 22, wherein the one or more vias of the at least one of the first electrode and second electrode are exposed to the inner volume of the corresponding aperture.

24. The modulation device of claim 22, wherein the exposed conductive elements are provided with a substantially inert conductive coating.

25. The modulation device of claim 24, wherein the coating is selected from a group of materials consisting of chromium-molybdenum, CrMo, gold and platinum.

26. The modulation device of claim 1, wherein the interconnect structure comprises 4-10 metallization levels.

27. The modulation device of claim 1, wherein electrical connections within metallization levels are made using interconnects made of copper, and wherein vias in the via levels are made of copper.

28. The modulation device of claim 1, wherein electrical connections within metallization levels are made using interconnects made of aluminum, and wherein vias in the via levels are made of tungsten.

29. The modulation device of claim 1, wherein the apertures of the modulators extend through the body of the interconnect structure in a direction substantially perpendicular to the planes of the metallization and via levels.

* * * * *